United States Patent [19]

Dlouhy et al.

[11] Patent Number: 4,793,101
[45] Date of Patent: Dec. 27, 1988

[54] METHOD OF MAKING AN ENCIRCLING GROOVE ON THE EDGE OF A SEMICONDUCTOR SLICE OF A POWER SEMICONDUCTOR COMPONENT

[75] Inventors: Jiri Dlouhy, Mägenwil; Otto Kuhn, Lupfig; Andreas Rüegg, Gebenstorf, all of Switzerland

[73] Assignee: BBC Brown Boveri AG, Baden, Switzerland

[21] Appl. No.: 108,710

[22] Filed: Oct. 15, 1987

[30] Foreign Application Priority Data

Oct. 22, 1986 [CH] Switzerland ............... 4212/86

[51] Int. Cl.$^4$ ............................................. B24B 1/00
[52] U.S. Cl. ........................................ 51/283 E; 51/327
[58] Field of Search ............... 51/283 E, 284 E, 327, 51/326, 281 SF; 29/576, 580, 583

[56] References Cited

U.S. PATENT DOCUMENTS

| | | | |
|---|---|---|---|
| 2,293,291 | 8/1942 | Gaspari | 51/106 LG |
| 3,628,294 | 12/1971 | Stattler et al. | 51/326 |
| 4,286,415 | 9/1981 | Loreto | 51/283 E |
| 4,344,260 | 8/1982 | Ogiwara | 51/283 E |

FOREIGN PATENT DOCUMENTS

| | | | |
|---|---|---|---|
| 2623812 | 12/1977 | Fed. Rep. of Germany | 51/3 |
| 0134294 | 11/1978 | Japan | 51/209 R |
| 0143948 | 8/1983 | Japan | 51/281 SF |

Primary Examiner—Frederick R. Schmidt
Assistant Examiner—Robert A. Rose
Attorney, Agent, or Firm—Oblon, Fisher, Spivak, McClelland & Maier

[57] ABSTRACT

In a method of making an encircling groove (8) on the edge of a semiconductor slice (5) of a power semiconductor component, first of all the edge is surface-ground and then the groove (8) is ground in one operation by means of a form-grinding wheel (3) correspondingly contoured on the edge. An especially high output is achieved with diamond grinding wheels of appropriate grain size and suitable bond.

4 Claims, 2 Drawing Sheets

METHOD OF MAKING AN ENCIRCLING GROOVE ON THE EDGE OF A SEMICONDUCTOR SLICE OF A POWER SEMICONDUCTOR COMPONENT

DESCRIPTION

1. Technical Field

The invention relates to the manufacture of power semiconductor components. In particular, it relates to a method of making an encircling groove on the edge of a semiconductor slice of a power semiconductor component in which the groove is mechanically ground into the semiconductor slice.

2. Prior art

In the technology of power semiconductor components, it has been known for a long time to provide an encircling groove as an edge contour for the semiconductor slices of symmetric thyristors of high blocking capacity.

In order to make such grooves in mass production, the most varied methods have been proposed. Thus it is known, for example from DE-AS No. 1,439,215, to etch or grind the groove into the semiconductor slice by means of a suitable acid or sand blast. It is pointed out in the same publication, without further particulars, that he groove can also be produced with purely mechanical means such as emery disks or the like.

Such mechanical means and their use are described in greater detail in German Offenlegungsschrift No. 1,764,326, where abrasive wires or abrasive plates of different graded thickness are used for making the groove in successive grinding operations.

In practice, however, it has been shown that particularly the mechanical removal of the semiconductor material either requires very complicated working operations (as shown in German Offenlegungsschrift No. 1,764,326) or else does not lead to useful results, since the semiconductor slice is very sensitive to the mechanical action.

In the past, therefore, in the mass production of power semiconductor components having a groove-shaped edge contour, only the abovementioned sand blasting method has been used, which, however, especially when the thickness of the semiconductor slices increases, has considerable disadvantages:

The working time increases quite considerably as the slice thickness increases. Even at a thickness of 1100 $\mu$m it has reached the bounds of expediency;

the protective lacquer necessary during sand blasting is increasingly removed as the sanding time increases. From about 1300 $\mu$m slice thickness, even 2 coatings of protective lacquer are no longer sufficient, so that thyristors with 8–10 kV blocking voltage can no longer be worked in this manner; and the tolerances of the sand blasting process do not permit an exactly reproducible position and shape of the groove.

It follows from the above that it is very desirable, for working the groove, to replace the previously used sand blasting process by a mechanical process suitable for mass production.

REPRESENTATION OF THE INVENTION

The object of the present invention is therefore to create a mechanical method of making a groove which is correspondingly simple to carry out and permits a high output of functionable components in mass production.

The object is achieved in a method of the type mentioned at the beginning when (a) the edge of the semiconductor slice is first of all surface-ground; and (b) the groove is then ground in one operation by means of a form-grinding wheel correspondingly contoured on the edge.

By the separation according to the invention of the contouring operation into the two steps of surface grinding and grinding-in the groove, the very sensitive edge parts of the groove can be treated separately in themselves, whereas the actual groove can be made in the semiconductor slice in a simplified operation.

According to a preferred exemplary embodiment of the invention, the surface-grinding operation is in turn subdivided into two steps, with surplus semiconductor material being removed in a first step with a rough-grinding wheel, and the edge surface which has developed being finish-machined in a second step with a precision-grinding wheel.

Diamond grinding wheels of different grain size and with a concentration of about 4.4 carats/$cm^3$ are preferably used as the grinding wheels. It is especially favorable if, in the rough-grinding wheel and the form-grinding wheel, the diamond grains are present in a metal bond, and, in the precision-grinding wheel, the diamond grains are embedded in a synthetic bond.

BRIEF DESCRIPTION OF THE DRAWINGS

The invention is to be described in greater detail below with reference to exemplary embodiments and in connection with the drawing, in which.

WAYS OF EMBODYING THE INVENTION

Figure 1:
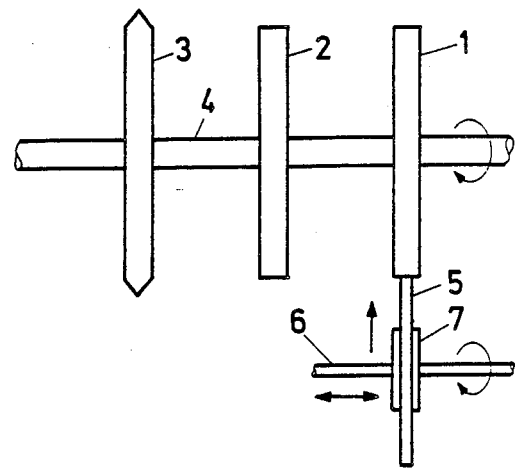
FIG. 1 schematically shows the rough-grinding operation.
Figure 2:
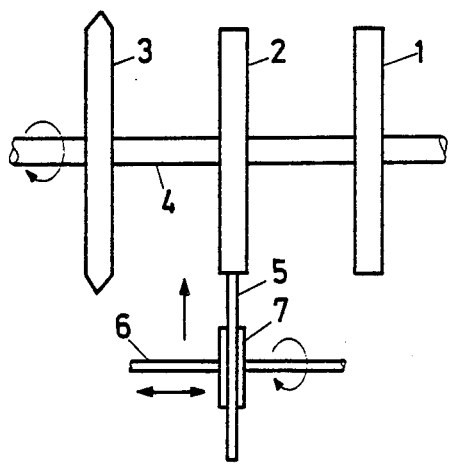
FIG. 2 correspondingly shows the precision-grinding operation.
Figure 3:
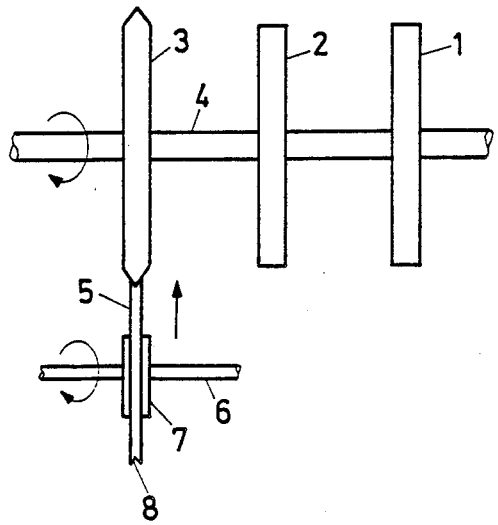
FIG. 3 shows in the same manner the groove-grinding or form-grinding operation.
Figure 4:
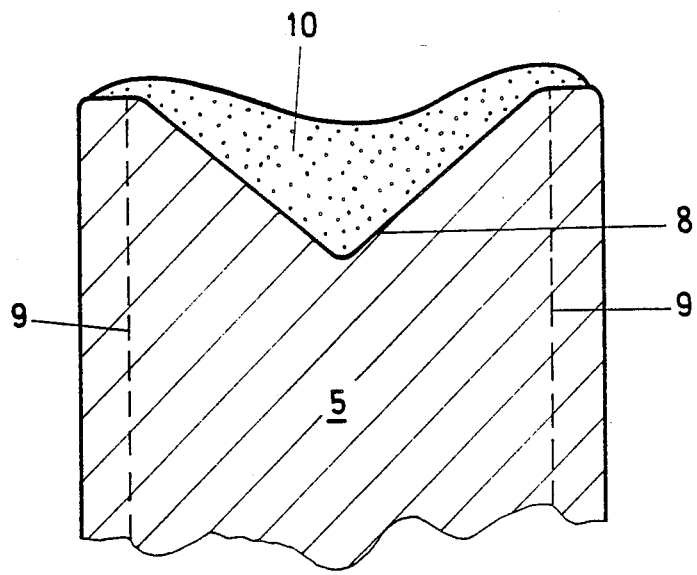
FIG. 4 shows a detail of the cross-section through a semiconductor slice with a groove.

FIGS. 1 to 3 schematically show in corresponding sequence the individual steps according to a preferred exemplary embodiment of the method according to the invention.

The starting point is a completely diffused, essentially round semiconductor slice 5 which normally has a diameter of several cm and a thickness in the order of magnitude of about 1000 $\mu$m. When the internal structure of the component is produced, an edge is left on the semiconductor slice 5 which has to be removed on completion of the component.

This edge is removed in an initial rough-grinding process with a rough-grinding wheel 1 which is preferably arranged (FIG. 1) on a common grinding-wheel spindle 4 together with a precision-grinding wheel 2 and a form-grinding wheel 3 and rotates in the direction indicated by the rotary arrow.

The semiconductor slice 5 is rotatably mounted in a mounting 7 on a semiconductor-slice spindle 6 running parallel to the grinding-wheel spindle 4 and is pushed with its end face against the end face of the rough-grinding wheel 1 at a feed rate of preferably 3 mm/min.

During the grinding operation, the rough-grinding wheel 1 rotates about the grinding-wheel spindle at such a speed that the cutting speed, i.e. its peripheral speed, is about 35 m/s.

In order to ensure that the semiconductor material is removed as uniformly as possible, the semiconductor slice 5 is on the one hand moved in a reciprocating manner parallel to the axis of rotation, i.e. parallel to the semiconductor-slice spindle 6 or the grinding-wheel spindle 4, beyond the edge of the rough-grinding wheel 1 during the grinding operation (indicated in FIG. 1 by the double arrow). On the other hand, the semiconductor slice 5 rotates in the opposite direction to the rough-grinding wheel 1 during the grinding operation, and in fact preferably at a rotation of 80 revolutions/min.

Water to which a rust preventative has been added for protecting the grinding devices has proved successful as a coolant for all grinding operations described here.

Since it is of prime importance during rough grinding for material to be removed rapidly if a long service life is to be achieved for the rough-grinding wheel 1, a diamond grinding wheel in which diamond grains with an average diameter of 25 $\mu$m are present in a metal bond is preferably used as the rough-grinding wheel.

After the surplus edge layers of the semiconductor slice 5 have been largely removed in a short time during the rough-grinding operation according to FIG. 1, a precision-grinding operation follows with the precision-grinding wheel 2 according to FIG. 2.

During the precision grinding, the same rotational speeds, cutting speeds and reciprocating movements as during rough grinding are provided for the semiconductor slice 5 and the precision-grinding wheel 2. On the other hand, the feed rate is different, which here, at 1 mm/min, is clearly lower.

This is connected, inter alia, with the fact that the precision-grinding wheel 2 has different properties from the rough-grinding wheel 1. Although the precision-grinding wheel is a diamond grinding wheel here too, diamond grains with an average diameter of 20 $\mu$m are used. More important, however, is the difference that the diamond grains in the precision-grinding wheel 2 are present in a softer synthetic bond in order to avoid chipping at the edge of the semiconductor slice 5. On the other hand, dimensional stability and service life in the case of the precision-grinding wheel 2 are not so important, since during precision grinding the material removal is relatively slight.

With the precision grinding, the edge surface of the semiconductor slice is finish-machined in such a way that only minor defects, which can be completely removed in a later etching operation, are present in the semiconductor crystal.

Finally, the actual grinding of the groove 8 (FIG. 3) follows the precision-grinding operation. This grinding is carried out in a single operation with a form-grinding wheel 3 which is contoured at the edge in accordance with the groove shape. It goes without saying that the semiconductor slice 5 does not execute any reciprocating transverse motion during this grinding operation. The feed rate here is likewise 1 mm/min. The form-grinding wheel 3 is again a diamond grinding wheel which contains diamond grains with an average diameter of 16 $\mu$m in a metal bond. The metal bond is again selected here in order to achieve an adequate service life for the grinding wheel in the face of the relatively large material removal in the groove and above all to also ensure the necessary dimensional stability of the contour.

The arrangement of all three grinding wheels 1, 2 and 3 on the common grinding-wheel spindle 4 has the advantage that a high dimensional accuracy can be achieved during the working. Moreover, a diamond grain concentration of about 4.4 carats/cm$^3$ has proved favorable for all grinding wheels.

The method according to the invention has been exhaustively tested on semiconductor slices for thyristors with blocking voltages of 4400 and 8000 V respectively. The corresponding thickness of the semiconductor slices in these tests was 940 $\mu$m and 1000 $\mu$m respectively. Here, diamond grinding wheels are used which can be obtained under the trade name "Superfix", e.g. from Diametal AG, CH-2500 Biel/Switzerland. In order to show the significance of the special precision grinding, the semiconductor slices were partly finish-machined with precision-grinding wheels with a metal bond and partly with precision-grinding wheels with a synthetic bond. The following were produced:

|  | Total | Blocking |
| --- | --- | --- |
| 4400 V elements: |  |  |
| Precision grinding with metal bond | 10 | 0 |
| Precision grinding with synthetic bond | 60 | 42 |
| 8000 V elements: |  |  |
| Precision grinding with synthetic bond | 17 | 16 |

These results clearly show the importance of the precision-grinding operation for producing the functionable, i.e. blocking components.

After the grinding procedures described, the semiconductor slices are etched and passivated in conventional manner. The cross-section through the edge area of such a finished 8000 V element is shown in FIG. 5. The shape of the groove 8 with the edge passivation 10 located above it is clearly recognizable. Indicated by a broken line is the position of the critical pn-junction 9.

On the whole, the invention provides a method of making grooves in semiconductor components having a high blocking capacity, which method is simple to carry out, gives a high output and reproducible results.

LIST OF REFERENCE NUMERALS

1: Rough-grinding wheel
2: Precision-grinding wheel
3: Form-grinding wheel
4: Grinding-wheel spindle
5: Semiconductor slice
6: Semiconductor-slice spindle
7: Mounting
8: Groove
9: pn-junction
10: Edge passivation

We claim:

1. A method of making an encircling groove on an edge of a semiconductor slice of a power semiconductor component, comprising the steps of:
   rough grinding surplus semiconductor material from the edge of the semiconductor slice with a rough grinding wheel having diamond grains with an average diameter of 25 $\mu$m in a metal bond, with a concentration of 4.4 carats/cm$^3$;
   finish grinding the rough ground edge of the semiconductor slice with a precision grinding wheel having diamond grains with an average diameter of 20 μm in a synthetic bond, with a concentration of 4.4 carats/cm$^2$;

grinding an encircling groove in the finish ground edge of the semiconductor slice with a form grinding wheel correspondingly contoured on an edge thereof, said form grinding wheel having diamond grains with an average diameter of 16 μm in a metal bond, with a concentration of 4.4 carats/cm$^2$; and cooling the ground edge with water having a rust preventative in all of said grinding steps, wherein all of said grinding steps are carried out at a cutting speed of 35 m/sec. with the semiconductor slice rotating at about 80 revolutions/min. and in a direction opposite to that of each respective said grinding wheel.

2. The method as claimed in claim 1, wherein all of said grinding wheels are arranged on a common grinding-wheel spindle.

3. The method as claimed in claim 1, wherein the semiconductor slice, during the surface grinding step, is moved in a reciprocating manner parallel to an axis of rotation thereof and beyond the edge of the respective grinding wheel.

4. The method as claimed in claim 1, wherein the feed of the semiconductor slice toward the grinding wheels is about 3 mm/min during the rough grinding step and about 1 mm/min during the precision and groove grinding.

* * * * *